(12) United States Patent
Yasuda et al.

(10) Patent No.: US 6,373,189 B1
(45) Date of Patent: Apr. 16, 2002

(54) MERCURY LAMP OF THE SHORT ARC TYPE HAVING SPECIFIC RELATIONSHIP WITH VARIOUS DIMENSIONS OF THE BULB AND UV EMISSION DEVICE

(75) Inventors: Yukio Yasuda; Motohiro Sakai; Yoshinori Aiura, all of Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/270,845

(22) Filed: Mar. 18, 1999

(30) Foreign Application Priority Data

Mar. 24, 1998 (JP) .......................... 10-093847

(51) Int. Cl.⁷ .......................... H01J 61/30; H01J 61/20
(52) U.S. Cl. .......................... 313/571; 313/573; 313/631
(58) Field of Search .................. 313/567, 568, 313/569, 570, 571, 573, 577, 637, 639, 641, 642, 643, 620, 621, 631, 632

(56) References Cited

U.S. PATENT DOCUMENTS

| | | | | |
|---|---|---|---|---|
| 3,706,000 A | * | 12/1972 | Retzer et al. | 313/214 |
| 5,541,481 A | * | 7/1996 | Yamaguchi et al. | 313/638 |
| 5,627,430 A | * | 5/1997 | Kira et al. | 313/570 |
| 5,986,402 A | * | 11/1999 | Narita et al. | 313/620 |
| 6,107,741 A | * | 8/2000 | Yamaguchi et al. | 313/631 |
| 6,133,694 A | * | 10/2000 | Cekic et al. | 313/570 |

\* cited by examiner

*Primary Examiner*—Nimeshkumar D. Patel
*Assistant Examiner*—Karabi Guharay
(74) *Attorney, Agent, or Firm*—Nixon Peabody LLP; David S. Safran

(57) ABSTRACT

To devise a mercury lamp of the short arc type with high radiant efficiency and increased arc stability which meets the demand for increasing the amount of radiation from the light source. In a mercury lamp of the short arc type, a cathode and an anode are disposed opposite one another within an arc tube filled with mercury and a rare gas. At least argon (Ar) and/or krypton (Kr) in an amount from 1.0 to 8.0 atm at room temperature is added as the rare gas. In addition, the relationship between various dimensions of the lamp is fixed such that conditions $0.3 \leq X/L \leq 0.6$, $(X+5)/D \leq 0.85$, and $(L-(X+5))/D \leq 0.85$ are satisfied, L (mm) being the length of the bulb in the axial direction, X (mm) being the length of the cathode which projects in the axial direction into the emission space, and D (mm) being the maximum outside diameter of the bulb in the radial direction.

10 Claims, 4 Drawing Sheets

| lamp no. | pressure Xe(atm) | pressure ArKr(atm) | voltage (V) | current (A) | relative irradiance of the i-line |
|---|---|---|---|---|---|
| A | Xe(2.0) | 0 | 26.9 | 78.1 | 1.00 |
| B1 | Xe(2.0) | Ar(0.3) | 25.1 | 83.7 | 1.02 |
| C1 | Xe(2.0) | Ar(1.0) | 25.6 | 82.0 | 1.06 |
| D1 | Xe(2.0) | Ar(3.0) | 26.6 | 78.9 | 1.12 |
| E1 | Xe(2.0) | Ar(8.0) | 27.4 | 76.6 | 1.18 |
| F1 | Xe(2.0) | Ar(12.0) | 28.5 | 73.7 | 1.20 |
| B2 | Xe(2.0) | Kr(0.3) | 25.4 | 82.7 | 1.01 |
| C2 | Xe(2.0) | Kr(1.0) | 25.9 | 81.1 | 1.04 |
| D2 | Xe(2.0) | Kr(3.0) | 27.0 | 77.8 | 1.08 |
| E2 | Xe(2.0) | Kr(8.0) | 27.9 | 75.3 | 1.13 |
| F2 | Xe(2.0) | Kr(12.0) | 29.0 | 72.4 | 1.15 |

Fig.3

| lamp no. | pressure Xe(atm) | pressure Ar(atm) | pressure Kr(atm) | pressure Ar+Kr | relative irradiance of the i-line |
|---|---|---|---|---|---|
| A | 2.0 | 0.0 | 0.0 | 0.0 | 1.00 |
| G | 0.0 | 0.3 | 0.3 | 0.6 | 1.03 |
| H | 0.0 | 0.5 | 0.5 | 1.0 | 1.05 |
| J | 0.0 | 1.5 | 1.5 | 3.0 | 1.10 |
| K | 0.0 | 4.0 | 4.0 | 8.0 | 1.15 |
| L | 0.0 | 5.0 | 5.0 | 10.0 | 1.17 |
| M | 0.3 | 0.5 | 0.5 | 1.0 | 1.05 |
| N | 3.0 | 0.5 | 0.5 | 1.0 | 1.04 |

Fig.4

| D | L | X | X/L | assessment |
|---|---|---|---|---|
| 55 | 60 | 15 | 0.25 | X |
| 55 | 60 | 20 | 0.33 | O |
| 55 | 60 | 35 | 0.56 | O |
| 55 | 60 | 40 | 0.67 | X |
| 70 | 80 | 20 | 0.25 | X |
| 70 | 80 | 25 | 0.31 | O |
| 70 | 80 | 45 | 0.56 | O |
| 70 | 80 | 50 | 0.63 | X |
| 85 | 100 | 25 | 0.25 | X |
| 85 | 100 | 30 | 0.30 | O |
| 85 | 100 | 60 | 0.60 | O |
| 85 | 100 | 65 | 0.65 | X |
| 100 | 120 | 35 | 0.29 | X |
| 100 | 120 | 40 | 0.33 | O |
| 100 | 120 | 70 | 0.58 | O |
| 100 | 120 | 75 | 0.63 | X |

Fig.5

| D | L | X | (X+5)/D | assessment |
|---|---|---|---|---|
| 40 | 60 | 25 | 0.75 | ○ |
| 40 | 60 | 30 | 0.88 | × |
| 60 | 90 | 45 | 0.83 | ○ |
| 60 | 90 | 50 | 0.92 | × |
| 80 | 120 | 60 | 0.81 | ○ |
| 80 | 120 | 65 | 0.88 | × |
| 100 | 150 | 80 | 0.85 | ○ |
| 100 | 150 | 85 | 0.90 | × |

| D | L | X | [L-(X+5)]/D | assessment |
|---|---|---|---|---|
| 40 | 60 | 20 | 0.88 | × |
| 40 | 60 | 25 | 0.75 | ○ |
| 60 | 90 | 30 | 0.92 | × |
| 60 | 90 | 35 | 0.83 | ○ |
| 80 | 120 | 45 | 0.88 | × |
| 80 | 120 | 50 | 0.81 | ○ |
| 100 | 150 | 55 | 0.90 | × |
| 100 | 150 | 60 | 0.85 | ○ |

MERCURY LAMP OF THE SHORT ARC TYPE HAVING SPECIFIC RELATIONSHIP WITH VARIOUS DIMENSIONS OF THE BULB AND UV EMISSION DEVICE

BACKGROUND OF THE INVENTION

1. Field of the Invention

The invention relates to a mercury lamp of the short arc type. The invention relates especially to a mercury lamp of the short arc type with high focusing efficiency and good light intensity stability which is used for a semiconductor exposure device.

2. Description of Related Art

Recently, in the exposure process in the manufacture of semiconductors, a mercury lamp of the short arc type has been used which emits UV radiation with a primary wavelength of 365 nm (hereinafter called the "i-line"). Since the degree of integration of an integrated solid-state circuit increases each year, there is a greater and greater demand for higher image resolution during exposure. Furthermore, due to the increase in the exposure surface as a result of increasing the wafer aperture or due to the modified illumination which is used to achieve a high image resolution, there is a demand for increasing the amount of UV radiation emitted from the light source (which is hereinafter called only the "amount of radiation").

Furthermore, there is also a demand for an increase in the throughput as indicated by the amount of production per unit of time. Therefore, there is a demand for high radiation efficiency in using the lamp as a light source, while at the same time, there is a demand for high focusing efficiency in using the lamp as an emission device.

To obtain intensive i-line radiation, conventionally, a process is used in which the input power supplied to the lamp is increased. However, when the input power supplied to the lamp is increased, the thermal burden on the electrodes also increases, thereby causing more vigorous vaporization of the electrode material and accelerating the blackening of the arc tube. Furthermore, by increasing the input power, the arc tube is required to have a larger outside dimension since a larger air blower device is needed to dissipate the heat produced by the lamp. Therefore, a process in which more intensive i-line radiation is obtained by increasing the input power supplied to the lamp is not desirable.

SUMMARY OF THE INVENTION

Therefore, a primary object of the present invention is to devise a mercury lamp of the short arc type in which an arc tube can be kept unfouled for a longer time and intensive i-line radiation can be obtained.

A further object of the invention is to devise a UV emission device which will effectively obtain the above object.

In a first aspect of the invention, these objects are achieved by a mercury lamp of the short arc type is provided including a cathode and an anode disposed opposite one another within a quartz arc tube filled with mercury and a rare gas of at least argon (Ar) or krypton (Kr) with a pressure from 1.0 to 8.0 atm are added at room temperature, and by satisfying the condition $0.3 \leq X/L \leq 0.6$, where L is the length of the arc tube in the axial direction in millimeters and X is the length of the cathode in millimeters which projects in the axial direction into the emission space, the direction between the anode and the cathode being defined as the axial direction.

In another aspect of the invention, these objects are achieved in a mercury lamp of the short arc type which corresponds to the lamp described in the preceding paragraph by adding the rare gas as a gas mixture of argon and krypton with a total pressure from 1.0 to 8.0 atm at room temperature instead of adding argon or krypton separately.

In accordance with yet another aspect of the invention, these objects are achieved in a mercury lamp of the short arc type which corresponds to the lamp described above by satisfying the conditions $0.85D \geq (X+5)$ and $0.85D \geq L-(X+5)$, where D is the maximum outside diameter of the arc tube in the radial direction in millimeters, the radial direction being defined as the direction of the cross section which is perpendicular to the axial direction of the arc tube.

The objects of the invention are furthermore achieved by a UV emission device which comprises:

a mercury lamp of the short arc type described above, and a power source which supplies a predetermined power to the mercury lamp.

Advantageously, in a UV emission device, the objects are furthermore achieved by the mercury lamp of the short arc type being arranged vertically such that the anode is at the top and the cathode is at the bottom.

The mercury lamp of the short arc type in accordance with the present invention is characterized in that at least argon (Ar) or krypton (Kr) or a mixture of these gases underpressure is added as the buffer gas. It was possible to confirm by tests that the above described measure prevents broadening of the spectral width of the i-line. Therefore, it was possible to ascertain that the irradiance of the exposure surface correspondingly increases. The reason for this is that the radiation efficiency increases by 10 to 20% as compared to adding xenon gas (Xe) at roughly 1 atm (this increased amount of efficiency corresponds to an increase of 20 to 40% when it is converted to power).

Furthermore, the invention is characterized by the fact that under the condition that at least argon (Ar) or krypton (Kr) or a mixture of these gases under pressure is added as the buffer gas with a predetermined pressure, the relationship between the various dimensions of the arc tube (hereinafter also called the "bulb") is fixed such that each of the dimensions of the bulb are dependent upon the other dimensions of the bulb. The expression "dimensions of the bulb" is defined specifically as the values of length of the bulb in the axial direction, the length of the cathode which projects in the axial direction into the emission space, and the maximum outside diameter of the bulb in the radial direction, the axial direction being defined as the direction between the anode and cathode, and the radial direction being defined as the direction of the cross section which is perpendicular to the axial direction.

The reason for fixing the relationship between the various dimensions of the bulb such that each of the dimensions of the bulb is dependent upon the other dimensions of the bulb lies in the fact that the added buffer gas largely determines the thermal behavior within the bulb, and therefore, exerts strong effects on the thermal behavior and the arc characteristic within the bulb when the molar ratio of the added buffer gas to the simultaneously added mercury is large.

The reason for the above described dependencies between the dimensions of the bulb is not entirely clear, but presumably lies in the following:

It can be imagined that the reason for the described dependencies lies in the different thermal conductivities of the Ar gas, the Kr gas and the Xe gas. If this thermal conductivity is high, the rate of transfer of the thermal energy increases. The temperature in the arc center is easily transferred into the vicinity of the inner bulb surface, while conversely, the temperature of the vicinity of the inner surface of the bulb is easily transferred to the arc center. In this case, the thermal conductivities of the Ar gas, the Kr gas and the Xe gas ($10^{-4}$ W/cm/K) are in the sequence (Ar: 1.63)>(Kr: 0.88)>(Xe: 0.50). The mercury lamp in which Ar gas or Kr gas is added is more easily influenced by air blowout cooling of the outside surface of the bulb and similar conditions than a mercury lamp filled with Xe gas. This leads to a temperature drop in the vicinity of the inner surface of the bulb and to a temperature drop in the arc center.

The different thermal conductivities exert major effects not only on the temperature drop in the arc center, but also on gas convection within the emission space. The stability of the arc thereby depends on this gas convection. When undesirable gas convection occurs, the arc stability is adversely affected which can also lead to formation of fluctuations.

The arc fluctuations formed by the temperature drop in the arc center or the undesirable gas convection cause fluctuations and nonuniformity of the illuminance of the exposure surface and also cause nonuniformity of exposure as well as reduction of image definition in a semiconductor exposure device.

Therefore, in a mercury lamp filled with Ar gas or Kr gas, the present applicants have found that stable gas convection is obtained by considering the lamp shape, bringing the ratio between the length of the bulb in the axial direction and the length of the cathode which projects into the emission space within a predetermined range. Furthermore, the applicants have ascertained that with this gas convection, arc fluctuations are advantageously prevented, while at the same time, the arc fluctuations due to the temperature drop in the arc center are also advantageously prevented.

Furthermore, it has also been found that arc fluctuations can also be advantageously prevented by fixing the relationship between the length of the bulb in the axial direction, the length of the cathode which projects into the emission space, and the maximum outside diameter of the bulb in the radial direction within a predetermined range.

In the following, a bulb for a mercury lamp of the short arc type which achieves the above described stable gas convection is described.

In a bulb for a mercury lamp of the short arc type, gas convection occurs through the inner gas which receives energy from the electrodes due to the heat radiation from the electrodes and by collisions of the inner gas with the electrodes, thus resulting in the formation of a rising air flow. This rising air flow ascends upwardly along the electrodes. Since the temperature of the inner surface of the bulb is relatively lower compared to the temperature in the arc center, the risen air flow drops toward the bottom along the inner surface of the bulb.

It was found that stable operation where arc fluctuations are prevented is attained when the condition $0.3 \leq X/L \leq 0.6$ is satisfied, where L is the length of the bulb in the axial direction in millimeters, and where X is the length of the cathode which projects in the axial direction into the emission space in millimeters, the direction between the anode and the cathode being defined as the axial direction.

When X/L is too large, the relative length of the anode becomes shorter. This reduces the heat radiation from the anode and therefore, the anode temperature rises. As a result, vaporization of the anode material is accelerated and blackening of the bulb occurs.

When X/L is too small, the length of the cathode which projects in the axial direction into the emission space is too low. In such a case, the air flow rising along the cathode is not adequately obtained. As a result, the air flow which descends toward the bottom along the inside of the bulb becomes stronger and predominates. Consequently the arc becomes unstable due to an unstable air flow which rises upward.

In a mercury lamp of the short arc type in accordance with the present invention, it has been found that the arc can be stabilized by fixing the relationship between the length L (mm) of the bulb in the axial direction, the length X (mm) of the cathode which projects in the axial direction into the emission space, and the maximum outside diameter D (mm) of the bulb in the radial direction in predetermined range.

The reason for this is as follows:

By fixing the relationship between D, L and X in a predetermined range, the cathode tip is located in a suitable position with respect to the diameter of the bulb, and thus, ensures that the air flow which descends along the inner surface of the bulb and the air flow which rises along the two electrodes is stable. Therefore, it can be seen how the arc is stabilized and fluctuations are reduced by the stabilized rising air flow.

When the diameter of the bulb is below a stipulated range, the electrodes of the inner surface of the bulb approach one another in relative terms. The air flow which rises along the two electrodes and the air flow which descends along the inner surface of the bulb partially collide; this causes an eddy flow and results in arc fluctuations.

As will be discussed, FIG. 7 shows specifically, the parameters for the present invention. The length of the bulb in the axial direction is labeled L, the length of the cathode which projects in the axial direction into the emission space is labeled X and the maximum outside diameter of the bulb in the radial direction is labeled D, the radial direction being defined as the direction of the cross section which is perpendicular to the axial direction. These reference labels each designate the parts shown in the drawing. Here, the length L of the bulb in the axial direction corresponds to the emission space from which the hermetically sealed portions are excluded. If the face sides of the emission space pass seamlessly into one another and can not be easily distinguished from the ends of the hermetically sealed portions, the base points of the electrodes are defined as the ends.

In the following section, the present invention is explained in detail using several different embodiments as shown in the drawings.

BRIEF DESCRIPTION OF THE DRAWINGS

FIG. 3 is a table of test results with respect to the radiation intensity of the i-line reflecting the action of the invention;

FIG. 4 is another table of test results with respect to the radiation intensity of the i-line reflecting the action of the invention;

FIG. 5 is a table of test results with respect to the arc stability reflecting the action of the present invention;

DETAILED DESCRIPTION OF THE INVENTION

Figure 1:
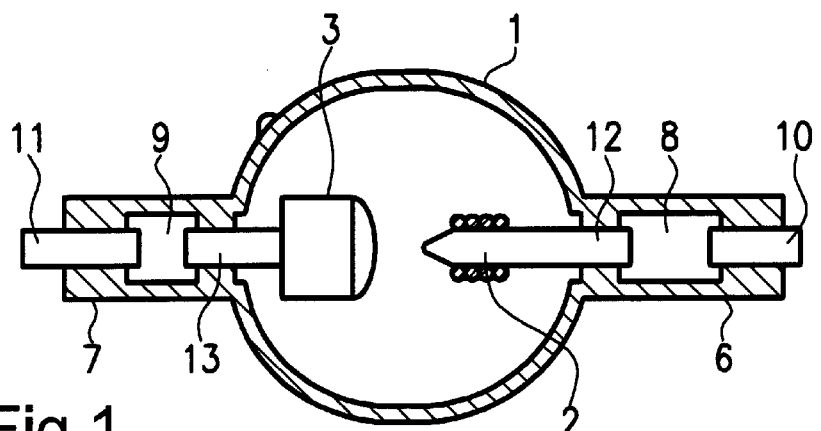
FIG. 1 is a schematic cross-sectional view of a mercury lamp of the short arc type in accordance with the present invention.

FIG. 1 is a schematic of a mercury lamp of the short arc type in accordance with one embodiment of the present invention having an arc tube 1 of quartz in which a cathode 2 and an anode 3 are located opposite one another. The electrodes are each connected via inner leads 12 and 13 to metal foils 8 and 9 in hermetically sealed portions 6 and 7. Outer leads 10 and 11 are connected to the metal foils 8 and 9 respectively.

Figure 2:
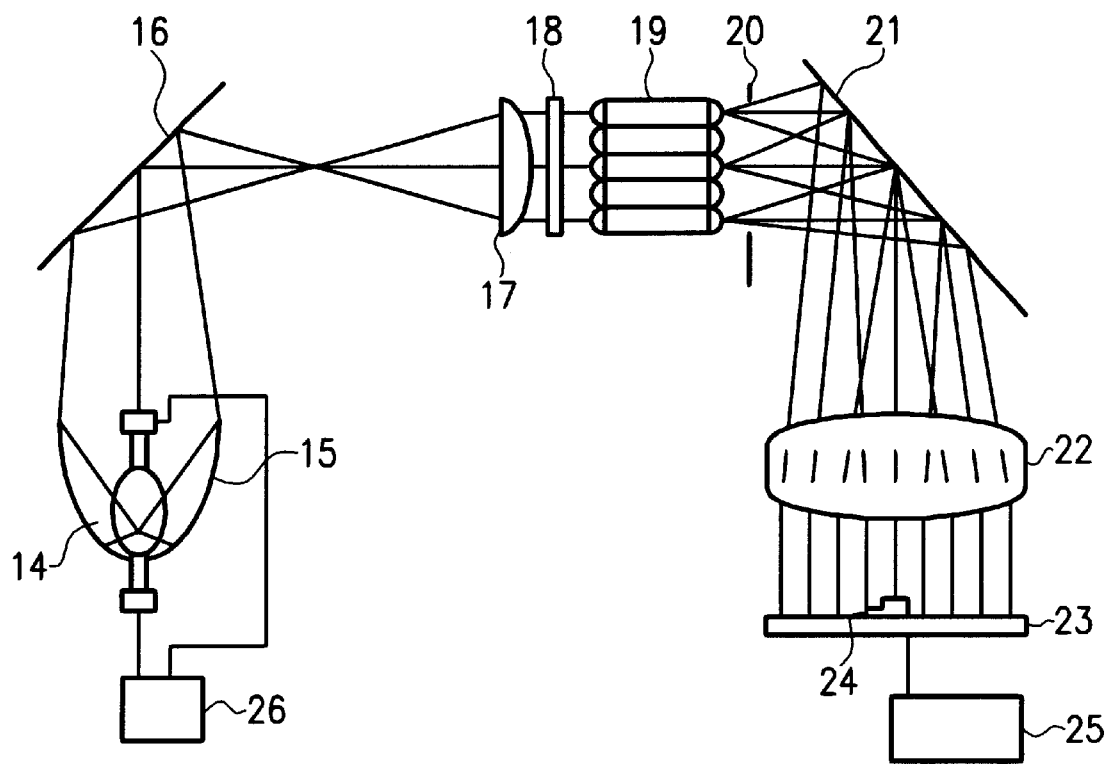
FIG. 2 is a schematic of a UV emission device according to the present invention.

FIG. 2 shows in schematic form, a UV emission device in which light emerging from the lamp 14 passes through a spheroidal mirror 15 and a flat reflector 16, reaches a collimator 17 and a bandpass filter 18 with a main wavelength of 365 nm and a bandwidth of 10 nm, passes through an integrator lens 19, is reflected by a flat reflector 21, passes through a condenser lens 22 and reaches a reticle surface 23. On the reticle surface 23, there is a silicon photo diode detector 24. A power source 26 is connected to the lamp 14 and the desired power is supplied.

Embodiment 1

In the following, one experimental example is described in which the radiation efficiency of the i-line was increased by adding argon or krypton as compared to a mercury lamp filled with xenon. Mercury lamps with the same conditions, except for the amount of argon, krypton and xenon added, were used in the test. The illuminance of the i-line was measured using the detector 24 as shown in FIG. 2. Specifically, the mercury lamps have the following specification:

In a roughly spherical arc tube of quartz with an outside diameter of roughly 55 mm, there is provided an anode 3 of tungsten with a diameter of 20 mm located a distance of 4.0 mm opposite a cathode 2 of tungsten which contains roughly 2% by weight thorium oxide with an effective tip diameter of 1.0 mm. Mercury is added in an amount of 4.5 mg/cc of arc tube inside volume.

A lamp (lamp A) in which 2 atm xenon were added at room temperature, five different lamps (lamps B1 to F1) in which in Ar was added in addition to Xe, and five different lamps (lamps B2 to F2) in which Kr was added in addition to Xe, were used. Five types of lamps in which Ar was added and of lamps in which Kr was added were produced at 0.3 atm, 1 atm, 3 atm, 8 atm and 12 atm and by changing the amount of gas added. These lamps were then operated by a constant current source with an input power of roughly 2100 W and in a lamp position in which the cathode is pointed upward.

FIG. 3 shows the test results. Here, the irradiance of the i-line by lamp A is assumed to be the comparative basis and the relative irradiance of the i-line of each of the respective lamps is shown.

It is assumed that the measurement errors of irradiance are 1 to 2%. Conventionally, it is believed that even with consideration of these measurement errors, the throughput in the exposure process in the production of semiconductors is clearly improved at an increase of at least 4%. The figure shows that for both argon and krypton, the relative irradiance is increased by at least 4% when the gases are added in an amount at least equal to 1 atm.

In the lamps (lamps F1 and F2) filled with 12 atm argon or krypton at room temperature, the irradiance increased by 20%. However, the spectral width of the i-line broadened; this caused a reduction of the image resolution during exposure. As a result it was found that in a mercury lamp filled with argon or krypton, by adding the argon or krypton in an amount of 1.0 atm to 8.0 atm, the irradiance can be effectively increased without the spectral width of the i-line broadening.

In the above described tests, lamps were devised in which argon (Ar) or krypton (Kr) was added together with xenon (Xe). However, it was confirmed that the same effect can be obtained when argon (Ar) or krypton (Kr) is added as an element without adding xenon (Xe).

When the filling pressure of the xenon is roughly tripled as compared to the filling pressure of the argon in the lamps filled with Ar and Xe as the rare gas, the irradiance of the i-line on the reticle surface rose according to the increase. However, it was found that the irradiance of the i-line hardly increases when the pressure at which xenon is added is increased even more. Therefore, it is preferred that in lamps in which Ar and Xe are added as the rare gas, the pressure at which the Xe is added is roughly tripled as compared to the pressure at which the Ar is added in order to increase the irradiance of the i-line on the reticle surface.

Furthermore, it was also confirmed that it is preferable that the pressure at which Xe is added be roughly triple that of the Kr pressure when Kr is added instead of Ar (i.e. a mixture of Kr and Xe is used).

Embodiment 2

Next, a test was run for lamps in which both Ar and Kr are added as the gas mixture. Apart from the amount of the gas mixture added, the respective lamp has the same specifications as in embodiment 1. Five lamps (G through N) were produced.

FIG. 4 shows the gas added to the respective lamp (A, G to N) and the pressure at which it was added. Lamp A is the same lamp A as in embodiment 1. Lamp A is filled with 2.0 atm of Xe. Lamps G through L contain no xenon, but contain Ar and Kr, each in an amount of 0.3 atm, 0.5 atm, 1.5 atm. 4.0 atm and 5.0 atm. In lamps M and N, Xe is added in an amount of 0.3 atm and 3.0 atm respectively and additionally Ar and Kr in an amount of 0.5 atm each.

FIG. 4 shows the results. When the lamp H filled with 0.5 atm Ar and 0.5 atm Kr at room temperature is compared to lamp A in which only Xe is added in an amount of 2 atm, it is apparent that the UV irradiance of the i-line on the reticle surface in lamp H compared to that in lamp A has increased by roughly 5% when they were used in an exposure device.

But, in lamp L, in which the arc tube was filled at room temperature with a mixture of 5.0 atm Ar and 5.0 atm Kr with a filling pressure of 10.0 atm, the irradiance of the i-line increased by 18%. However, here, the spectral width of the i-line broadened and the image resolution decreased during exposure.

In the test in which lamps were used as a heating apparatus, it was found that the relative irradiance of the i-line on the reticle surface is effectively increased when a gas mixture of Ar and Kr is added at room temperature with a total pressure of 1.0 atm to 8.0 atm.

Furthermore, it was also found that in lamps M and N in which Xe was added in addition to the gas mixture of Ar and Kr, the irradiance of the i-line can be effectively increased when the total filling pressure of Ar and Kr at room temperature is 1.0 atm to 8.0 atm. Comparison of lamp M with lamp N shows that when the filling pressure of Xe is increased, the irradiance of the i-line on-the reticle surface also rises accordingly.

On the other hand, the inventors confirmed by their experiments that the irradiance of the i-line hardly increases when the filling pressure of Xe is more than roughly triple the total filling pressure of Ar and Kr. Therefore, with respect to the increase of irradiance of the i-line, it is preferred that the filling pressure of Xe is increased only to roughly triple the total filling pressure of Ar and Kr.

Embodiment 3

In the following, one experimental example is described which illustrates how the arc stability is related to the bulb shape for the above described bulb filled with a rare gas and the dimensions L, X, and D illustrated in FIG. 7.

First, the relationship between the length of the bulb in the axial direction and the length of the cathode which projects into the emission space is described.

Lamps with the same shape as those used in the above discussed embodiment 1 were used. The amount of mercury added was 4.5 mg/cc while the amount of rare gas added was 1.5 atm in the case of Ar, 1.5 atm in the case of Kr, and 0.5 atm in the case of Xe. No other rare gas was added in any of these lamps. In these experiments, the length L (mm) of the bulb in the axial direction and the length X (mm) of the cathode which projects into the emission space were changed. A constant current source was used for lamp operation. In this test, the outside diameter of the bulb in the radial direction was not critical. However, since the size in the outside diameter also changes when the aforementioned parameters are changed, the diameter in the radial direction is also provided for information.

In the following, the process for measuring the arc fluctuations of the respective lamp is described. The maximum value "MA" and the minimum value "MI" of the output signals from the silicon photo diode detector 24 (shown in FIG. 2), which are indicative of the light on the reticle surface 23, were used to compute the degree of stability of the arc using the formula 2 (MA−MI)/(MA+MI)×100%. Conventionally, it is maintained that during the exposure, burn-in nonuniformity of exposure does not occur if the degree of stability of the arc does not exceed 5%. FIG. 5 provides a table of test results with respect to the degree of arc stability where allowable degree of stability which does not exceed 5% is indicated by "o", and where unallowable degree of stability exceeds 5% is indicated by "x". The results of the test indicates that the arc is stable when the value of X/L is 0.3 to 0.6.

Embodiment 4

In the following, a test is described in which the outside diameter of the bulb in the radial direction is also considered in addition to the length of the bulb in the axial direction and the length of the cathode which projects into the emission space.

The test was conducted with lamps having the same shape as the lamps used in embodiment 3 described above by changing the length L of the bulb in the axial direction, the length X of the cathode which projects in the axial direction into the emission space, and the diameter of the bulb in the radial direction. The measurement process and the like, were also identical to those used in embodiment 3, which was described above.

Figures 6, 7:
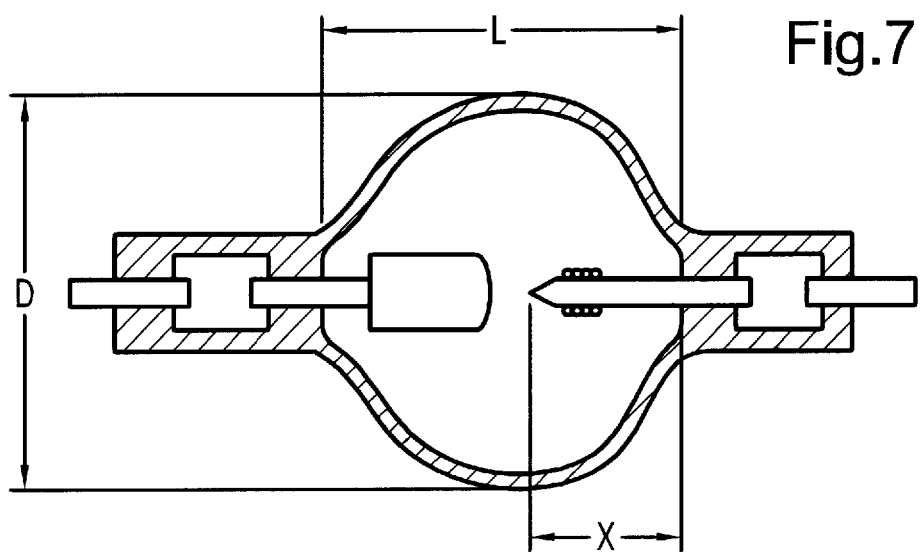
FIG. 6 is another table of test results with respect to the arc stability reflecting the action of the invention.
FIG. 7 is a schematic cross-sectional view of a mercury lamp of the short arc type indicating the key dimensional parameters in accordance with the present invention.

FIG. 6 shows a table of test results with respect to the arc stability indicating that the arc can be advantageously stabilized when conditions $(X+5)/D \leq 0.85$ and $(L-(X+5))/D \leq 0.85$ are satisfied.

Action of the Invention

As was described above, the irradiance of the exposure surface can be increased without broadening the spectral width of the i-line in a mercury lamp of the short arc type when argon (Ar) and/or krypton (Kr) is added as the rare gas at a pressure of 1.0 to 8.0 atm at room temperature.

Furthermore, arc fluctuations can be advantageously prevented by fixing the relationship between the length of the bulb in the axial direction, the length of the cathode which projects into the emission space, and the maximum outside diameter of the bulb in the radial direction in a predetermined range.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

What is claimed is:

1. Mercury lamp of the short arc type comprising a qua arc tube in which a cathode and an anode are disposed opposite one another and which is filled with mercury and a rare gas; wherein the rare gas comprises at least one of argon (Ar) and krypton (Kr) with a pressure from 1.0 to 8.0 atm at room temperature; also wherein the relationship $0.3 \leq X/L \leq 0.6$ is satisfied, where L is a length of the arc tube in an axial direction in mm, and X is a length of the cathode which projects in an axial direction into an emission space in mm, the direction between the anode and the cathode being defined as the axial direction, and wherein the relationships $0.85D \geq (X+5)$ and $0.85D \geq L-(X+5)$ are satisfied, where D is the maximum outside diameter of the arc tube in a radial direction in mm, the radial direction being defined as the direction of a cross section which is perpendicular to the axial direction of the arc tube.

2. Mercury lamp of the short arc type of claim 1, wherein the rare gas further comprises xenon (Xe) which is added with a pressure at room temperature which is at most triple the pressure of said at least one of argon and krypton.

3. Mercury lamp of the short arc type of claim 1, wherein the rare gas is a mixture of argon (Ar) and krypton (Kr) with a total pressure from 1.0 to 8.0 atm at room temperature.

4. Mercury lamp of the short arc type of claim 3, wherein the rare gas further comprises xenon (Xe) which is added with a pressure at room temperature which is at most triple said total pressure of said mixture of argon and krypton.

5. UV emission device comprising:

a mercury lamp of the short arc type comprising a quartz arc tube in which a cathode and an anode are disposed opposite one another and which is filled with mercury and a rare gas; wherein the rare gas comprises at least one of argon (Ar) and krypton (Kr) with a pressure from 1.0 to 8.0 atm at room temperature; also wherein the relationship $0.3 \leq X/L \leq 0.6$ is satisfied, where L is a length of the arc tube in an axial direction in mm, and X is the length of the cathode which projects in an axial direction into an emission space in mm, the direction between the anode and the cathode being defined as the axial direction, and wherein said mercury lamp satisfies the relationships $0.85D \leq (X+5)$ and $0.85D \leq L-(X+5)$, where D is a maximum outside diameter of the arc tube in a radial direction in mm, the radial direction being defined as the direction of a cross section which is perpendicular to the axial direction of the are tube, and a power source which supplies a predetermined amount of power to said mercury lamp.

6. UV emission device of claim 5, wherein said rare gas further comprises xenon (Xe) which is added with a pressure at room temperature which is at most triple the pressure of said at least one of argon and krypton.

7. UV emission device of claim 6, wherein the mercury lamp is arranged vertically such that the anode is at the top and the cathode is at the bottom.

8. UV emission device of claim 5, wherein the rare gas is a mixture of argon (Ar) and krypton (Kr) with a total pressure from 1.0 to 8.0 atm at room temperature.

9. UV emission device of claim 8, wherein the mercury lamp is arranged vertically such that the anode is at the top and the cathode is at the bottom.

10. UV emission device of claim 5, wherein the mercury lamp is arranged vertically such that the anode is at the top and the cathode is at the bottom.

\* \* \* \* \*